(12) United States Patent
Thedjoisworo et al.

(10) Patent No.: US 8,916,477 B2
(45) Date of Patent: Dec. 23, 2014

(54) POLYSILICON ETCH WITH HIGH SELECTIVITY

(71) Applicant: Novellus Systems, Inc., Fremont, CA (US)

(72) Inventors: Bayu Thedjoisworo, San Jose, CA (US); Jack Kuo, Pleasanton, CA (US); David Cheung, Foster City, CA (US); Joon Park, Dublin, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/916,387

(22) Filed: Jun. 12, 2013

(65) Prior Publication Data

US 2014/0004707 A1    Jan. 2, 2014

Related U.S. Application Data

(60) Provisional application No. 61/667,329, filed on Jul. 2, 2012.

(51) Int. Cl.
*H01L 21/302* (2006.01)
*H01L 21/3065* (2006.01)
*H01L 21/67* (2006.01)
*H01J 37/32* (2006.01)
*H01L 21/3213* (2006.01)

(52) U.S. Cl.
CPC ...... *H01L 21/3065* (2013.01); *H01L 21/67069* (2013.01); *H01J 37/32357* (2013.01); *H01L 21/32137* (2013.01)
USPC .......... 438/719; 216/37; 216/58; 216/67; 216/74; 216/79; 438/689; 438/694; 438/706; 438/710; 438/715; 438/735

(58) Field of Classification Search
CPC ............... H01L 21/31116; H01L 21/3065; H01L 21/67069; H01L 21/32135; H01J 37/32357
See application file for complete search history.

(56) References Cited

U.S. PATENT DOCUMENTS 7,767,024 B2    8/2010    Kao et al.
2002/0045355 A1    4/2002    Chong et al.

(Continued)

FOREIGN PATENT DOCUMENTS

EP    0658928    6/1995

OTHER PUBLICATIONS

Sidhwa, et al., "Reactive Ion Etching of Crystalline Silicon Using $NF_3$ Diluted with $H_2$," *J. Vac. Sci. Technol. A.*, vol. 11, No. 4, Jul./Aug. 1993, pp. 1156-1160.

Nishino, et al., Damage-Free Selective Etching of Si Native Oxides Using $NH_3/NF_3$ and $SF_6/H_2O$ Down-Flow Etching, J. Appl. Phys., vol. 74, No. 3, Jul. 15, 1993, pp. 1345-1348.

(Continued)

*Primary Examiner* — Lan Vinh
*Assistant Examiner* — Jiong-Ping Lu
(74) *Attorney, Agent, or Firm* — Weaver Austin Villeneuve & Sampson LLP

(57) ABSTRACT

Provided are methods and systems for removing polysilicon on a wafer. A wafer can include a polysilicon layer and an exposed nitride and/or oxide structure. An etchant with a hydrogen-based species, such as hydrogen gas, and a fluorine-based species, such as nitrogen trifluoride, can be introduced. The hydrogen-based species and the fluorine-based species can be activated with a remote plasma source. The layer of polysilicon on the wafer can be removed at a selectivity over the exposed nitride and/or oxide structure that is greater than about 500:1.

15 Claims, 8 Drawing Sheets

(56) References Cited

U.S. PATENT DOCUMENTS

| | | | |
|---|---|---|---|
| 2002/0185469 A1* | 12/2002 | Podlesnik et al. | 216/41 |
| 2009/0191714 A1 | 7/2009 | Lai et al. | |
| 2009/0246965 A1 | 10/2009 | Mori et al. | |
| 2011/0294300 A1* | 12/2011 | Zhang et al. | 438/719 |
| 2014/0004708 A1 | 1/2014 | Thedjoisworo et al. | |

OTHER PUBLICATIONS

U.S. Office Action, dated May 30, 2014, issued in U.S. Appl. No. 13/916,497.

Wolf, Stanley, Ph.D., (2002) "Silicon Processing for the VLSI Era," *Lattice Press, Sunset Beach*, 4:Chapter 3, p. 75.

\* cited by examiner

POLYSILICON ETCH WITH HIGH SELECTIVITY

CROSS-REFERENCE TO RELATED APPLICATION

This application claims the benefit of priority under 35 U.S.C. §119(e) to U.S. Provisional Application No. 61/667,329, titled "POLYSILICON ETCH WITH HIGH SELECTIVITY," filed Jul. 2, 2012, all of which is incorporated herein by this reference for all purposes.

BACKGROUND

The present disclosure relates generally to the etching of polysilicon, and more particularly to plasma-based etching of polysilicon with a high selectivity.

Plasma-based etching can be an important processing step in the fabrication of integrated circuits. Typically, removal of polysilicon can be performed using wet or dry reactive-ion-etch (RIE) processes.

A wet etching process can result in a low etch rate of polysilicon, which leads to a low throughput. Furthermore, a wet etching process may not achieve as high of selectivity over other materials as dry etching processes.

A dry RIE process can result in greater cost due at least in part to complicated hardware for controlling ion direction and energy using an external bias. In addition, the use of a dry RIE process can damage surrounding structures due to exposure to ion and photon fluxes. The surrounding structures can be sidewalls made of, for example, exposed nitrides and/or oxides. Such surrounding structures can include silicon nitride ($Si_3N_4$), titanium nitride (TiN), and silicon oxide ($SiO_2$) including thermal oxide.

SUMMARY

This disclosure pertains to a method of removing polysilicon from a wafer. The method of removing polysilicon from a wafer includes providing a wafer, where the wafer includes a polysilicon layer and an exposed nitride and/or oxide structure. The method further includes flowing an etchant including a hydrogen-based species and a fluorine-based species towards the wafer, exposing the etchant to a remote plasma to activate the hydrogen-based species and the fluorine-based species, and removing the polysilicon layer at a selectivity over the exposed nitride and/or oxide structure of greater than about 500:1. In some embodiments, the hydrogen-based species includes hydrogen or ammonia. In some embodiments, the fluorine-based species includes nitrogen trifluoride or carbon tetrafluoride. In some embodiments, the exposed nitride structure includes silicon nitride or titanium nitride, and/or the exposed oxide structure includes silicon dioxide. In some embodiments, removing the polysilicon layer is performed at an etch rate of greater than about 1000 Å per minute. In some embodiments, the concentration of the fluorine-based species can be between about 0.7% and about 10% by volume.

This disclosure also pertains to an apparatus, including a reaction chamber, where the reaction chamber includes a wafer that includes a polysilicon layer and an exposed nitride and/or oxide structure. The apparatus also includes a plasma source coupled to the reaction chamber and configured to generate a plasma outside the reaction chamber, and a controller. The controller can be configured with instructions for perform: (a) flowing an etchant including a hydrogen-based species and a fluorine-based species towards the wafer, (b) exposing the etchant to the plasma to activate the hydrogen-based species and the fluorine-based species, and (c) removing the polysilicon layer at a selectivity over the exposed nitride and/or oxide structure of greater than about 500:1. In some embodiments, the plasma source includes a remote downstream plasma reactor. In some embodiments, the hydrogen-based species includes hydrogen or ammonia. In some embodiments, the fluorine-based species includes nitrogen trifluoride or carbon tetrafluoride. In some embodiments, an etch rate of the polysilicon layer is greater than about 1000 Å per minute and an etch rate of the exposed nitride and/or oxide structure is less than about 5 Å per minute during removal of the polysilicon layer. In some embodiments, the temperature of the wafer is between about 60° C. and about 100° C.

These and other embodiments are described further below with reference to the figures.

DETAILED DESCRIPTION

Introduction

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Plasma-based etching can be used in the fabrication of integrated circuits. For a variety of technology nodes, such as in the 1x-nm or the 2x-nm node, new classes of materials for structures such as memory-device stacks can offer tremendous advantages. Fabrication processes such as etching of a particular layer may need to be relatively benign to such new materials while also etching at a high efficiency. While it may be desirable to achieve etching of certain materials like polysilicon at a high efficiency for high throughput, it may also be desirable to minimize losses to surrounding exposed materials to avoid adversely affecting device performance.

A remote or downstream plasma can provide acceptable etch rates while minimizing losses of surrounding materials. In some implementations, for example, the materials can include silicon nitride ($Si_3N_4$) and/or titanium nitride (TiN). The $Si_3N_4$ can be used as spacers and/or etch stop layers, and the TiN can be used as metal-gate structures or electrodes. A remote or downstream plasma can provide conditions that can minimize the damage caused by direct plasma exposure, including ion impact damage, charging damage, and defects introduced by high fluxes of energetic photons.

Plasma Reactor and Process Chamber

Figure 1:
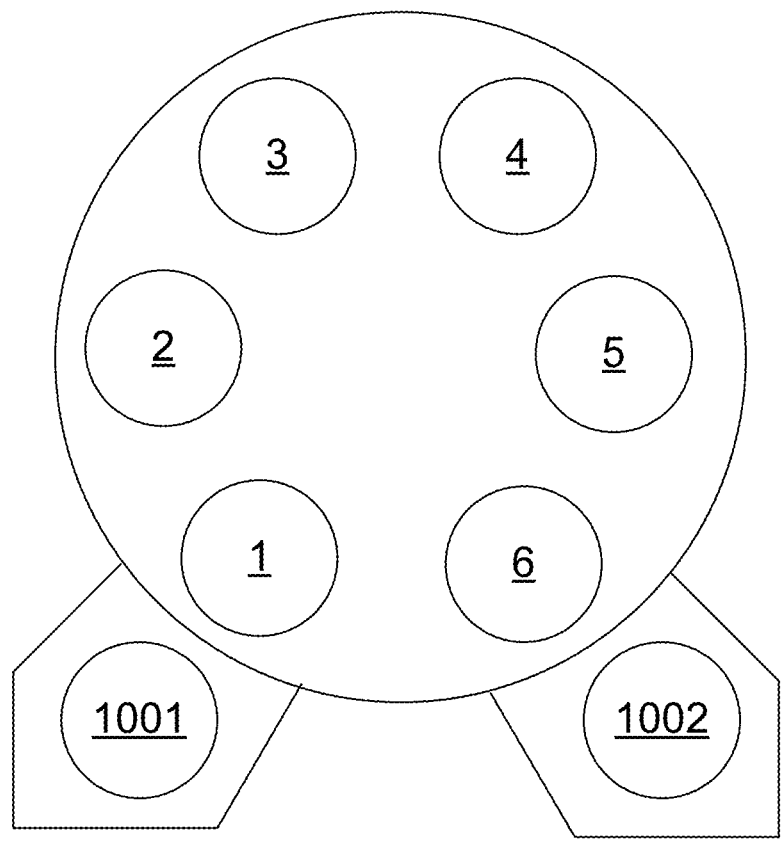
FIG. 1 is a simplified schematic showing a top view of a multi-station processing apparatus.

The process chamber can include any suitable reaction chamber for the etching operation being performed. It may be one chamber of a multi-chambered apparatus or it may simply be a single chamber apparatus. The chamber may also include multiple stations where different wafers are processed simultaneously. FIG. 1 is a simplified schematic showing a top view of a multi-station apparatus including stations 1, 2, 3, 4, 5, and 6. Wafers enter the apparatus at station 1 via chamber 1001, are transferred to each station in sequence for a processing operation at that station and exit from station 6 via chamber 1002 after the process is complete. Some of the stations may be configured with a remote plasma source for performing the operations described herein.

Plasma reactor apparatus include apparatus configured to remove photoresist materials and other materials from device structures such as integrated circuits. Examples of such apparatus include the Gamma 2100, 2130 I2CP (Interlaced Inductively Coupled Plasma), G400, GxT, and the SIERRA, offered by Lam Research Corporation of Fremont, Calif. Other systems include the Fusion line from Axcelis Technologies Inc. of Rockville, Md., TERA21 from PSK Tech Inc. in Korea, and the Aspen from Mattson Technology Inc. in Fremont, Calif. Additionally, various plasma reaction chambers may be associated with cluster tools. For example, a strip chamber may be added to a Centura cluster tool available from Applied Materials of Santa Clara, Calif.

Figure 2:
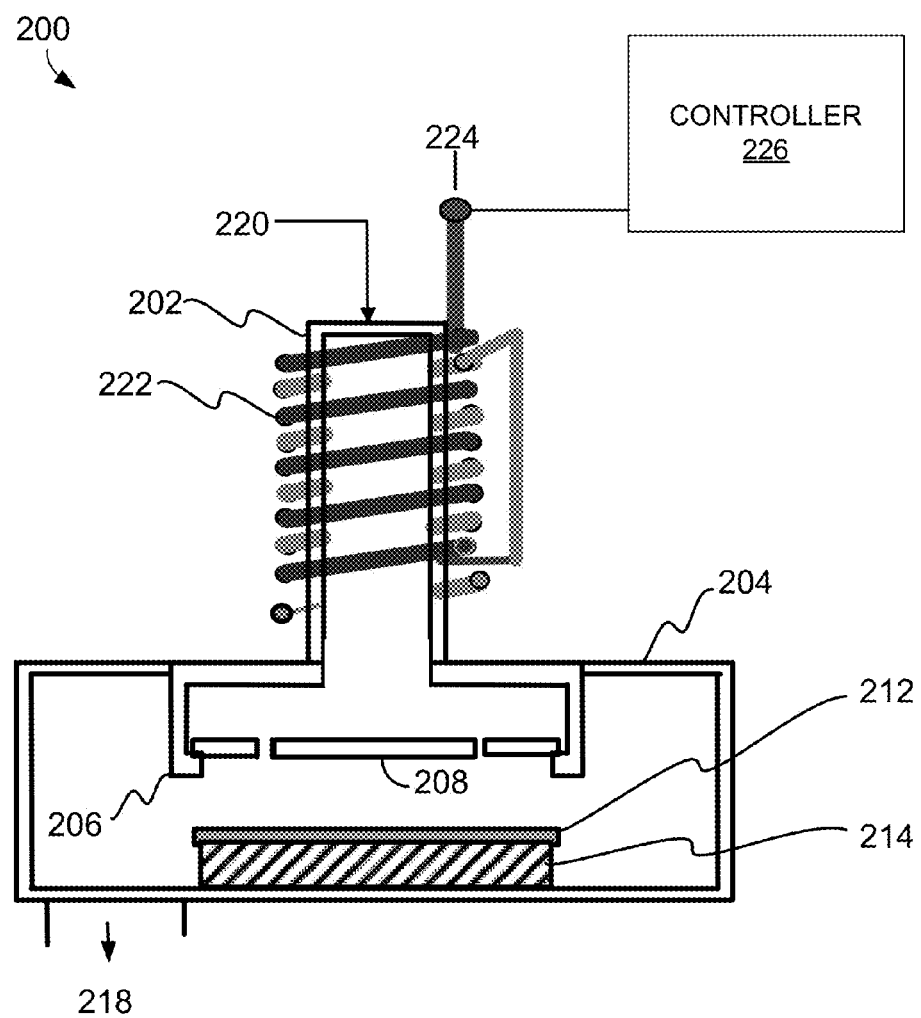
FIG. 2 illustrates a downstream plasma device according to certain embodiments.

FIG. 2 is a schematic illustration of a downstream plasma device 200 according to certain embodiments. The device 200 has a downstream plasma source chamber 202 and an exposure chamber 204 separated by a showerhead assembly 206. The showerhead assembly 206 includes a showerhead 208. Inside the exposure chamber 204, a wafer 212 rests on a platen, stage, or work piece support 214. In some embodiments the surface of the showerhead 208 facing the platen 214 is about 0.5 to 2 inches from the surface of a wafer on the platen 214. In further embodiments the surface of the showerhead 208 facing the platen 214 is about 1.2 inches from the surface of a wafer on the platen 214. In yet further embodiments the surface of the showerhead 208 facing the platen 214 is about 0.1 to 0.9 inches from the surface of a wafer on the platen. The thicknesses of wafers is generally less than about 1 mm, so the distance between the surface of the showerhead and the surface of a wafer can generally be considered the distance between the surface of the showerhead and the platen when the wafer rests directly on the platen. In cases where the wafer rests on a support structure (e.g., lift pins or a gas flow blanket) on the platen, the distance between the surface of the showerhead and the surface of a wafer can generally be considered the distance between the surface of the showerhead and the support structure.

In some embodiments the platen 214 is fitted with a heating/cooling element. In some embodiments, a radio frequency (RF) power source (not shown) can be configured to apply RF power to the platen 214 to provide a bias source. However, many of the embodiments discussed hereinafter below do not employ a bias source to the platen 214. The RF power source can be a low frequency (LF) power source in some embodiments, and the RF power source can be a high frequency (HF) power source in other embodiments. For example, the low frequency power source has a frequency of about 50 kilo-Hertz (kHz) to 1 mega-Hertz (MHz) and the high frequency power source has a frequency of about 2 to 200 mega-Hertz (MHz), in some embodiments. In other embodiments the low frequency power source has a frequency of about 400 kHz and the high frequency power source has a frequency of about 13.56 MHz. In further embodiments the RF power source includes both a LF and a HF power source.

Low pressure is attained in the exposure chamber 204 via a vacuum pump (not shown) via a conduit 218. The pressure in the exposure chamber 204 can be about 300 milli-torr (mtorr) to 3.5 ton in some embodiments, and about 5 mtorr to over 200 mtorr in further embodiments.

Gas sources (not shown) provide a flow of process gas via an inlet 220 into the plasma source chamber 202 of the device 200. The plasma source chamber 202 is surrounded in part by induction coils 222, which are in turn connected to a power source 224. Various configurations and geometries of the plasma source chamber 202 and the induction coils 222 may be used. For example, the induction coils 222 may loop around the plasma source chamber 202 in an interlaced pattern. In another example, the plasma source chamber 202 may be shaped as a dome instead of a cylinder. A controller 226 may be connected to components of the device 200 to control the operation of device 200. For example, the controller 226 may be connected to the power supply 224. The controller 226 may also be connected to other components of the device 200 to control, for example, the process gas composition, the pressure, and the temperature of the platen 214. Machine-readable media may be coupled to the controller 224 and contain instructions for controlling process conditions for the operations in the device 200.

Various types of plasma sources may be used in accordance with the invention, including RF, DC, and microwave based plasma sources. In a preferred embodiment, a downstream RF plasma source is used. Typically, the RF plasma power for a 300 mm wafer ranges between about 300 Watts to about 10 Kilowatts. In some embodiments, the RF plasma power is between about 2000 Watts and 5000 Watts, e.g., 3500 W.

In some embodiments, the plasma source chamber 202 can be a dome made of various materials, including quartz, ceramic, or aluminum nitride (AlN) material. Etching materials such as polysilicon in a quartz dome may lead to the formation of silicon oxide. However, etching polysilicon in a ceramic dome can minimize the formation silicon oxide. The dome surface can also be coated with films such as yttrium oxide or yttrium fluoride in order to reduce or otherwise prevent the degradation of the dome material.

During operation, gas mixtures are introduced into the plasma source chamber 202 and the induction coils 222 are energized with power source 224 to generate a plasma (i.e., the induction coils generate an inductively coupled plasma in the plasma source chamber 202). The gas mixtures introduced into the plasma source chamber 202 contain chemically active species that will be ionized and radicalized to form the plasma. The showerhead 208 includes a plurality of holes or passageways through which plasma species from the plasma may pass and enter the exposure chamber 204. The showerhead 208, with a voltage applied to it, in some embodiments, terminates the flow of ions from the plasma and allows the flow of radicals and other neutral species from the plasma into the exposure chamber 204. The showerhead 208 may be grounded or have an applied voltage to attract some charge species while not affecting the flow of neutral species to the wafer, e.g., 0-1000 Watt bias. Many of the electrically charged species in the plasma recombine at the showerhead. The showerhead may be a metal plate having holes to direct the plasma and inert gas mixture into the reaction chamber.

The number and arrangement of the showerhead holes may be set to optimize the etching operation. The plasma species that enter the exposure chamber 204 may remove material from the wafer 212.

Controller

The controller 226 may contain instructions for controlling process conditions for the operation of the device 200. The controller 226 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 226 or they may be provided over a network. Machine-readable media containing instructions for controlling process operations in accordance with the present invention may be communicatively coupled to the controller 226.

In certain embodiments, the controller 226 controls all or most activities of the downstream plasma device 200 described herein. The controller 226 may execute system control software and include sets of instructions for controlling the timing, gas composition, gas density, flow rates, chamber pressure, chamber temperature, RF power levels, wafer position, and/or other parameters. Other computer programs, scripts, or routines stored on memory devices associated with the controller 226 may be employed in some embodiments. To provide appropriate process conditions at the environment adjacent to the wafer 212, parameters such as the RF power levels, gas density, and timing of the plasma can be adjusted by controller 226.

The process conditions and the process flow itself can be controlled by the controller 226 which comprises program instructions for a monitoring, maintaining and/or adjusting certain process variables. For example, instructions specifying flow rates may be included. Instructions may also include parameters of pre-clean, passivation, protective layer formation, non-protective layer, pinning operations, other post-deposition treatments, etching, partial filling, and the like. The controller 226 may comprise different or identical instructions for different apparatus stations, thus allowing the apparatus stations to operate either independently or synchronously.

In some embodiments, the controller 226 may include instructions for performing a series of operations. This includes flowing an etchant including a hydrogen-based species and a fluorine-based species towards a wafer, where the wafer includes a polysilicon layer and an exposed nitride and/or oxide structure. The instructions further include exposing the etchant to a plasma source to activate the hydrogen-based species and the fluorine-based species, and removing the polysilicon layer at a selectivity over the exposed nitride and/or oxide structure of greater than about 500:1.

In some embodiments, there may be a user interface associated with controller 226. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

Device Structure

Figure 3:
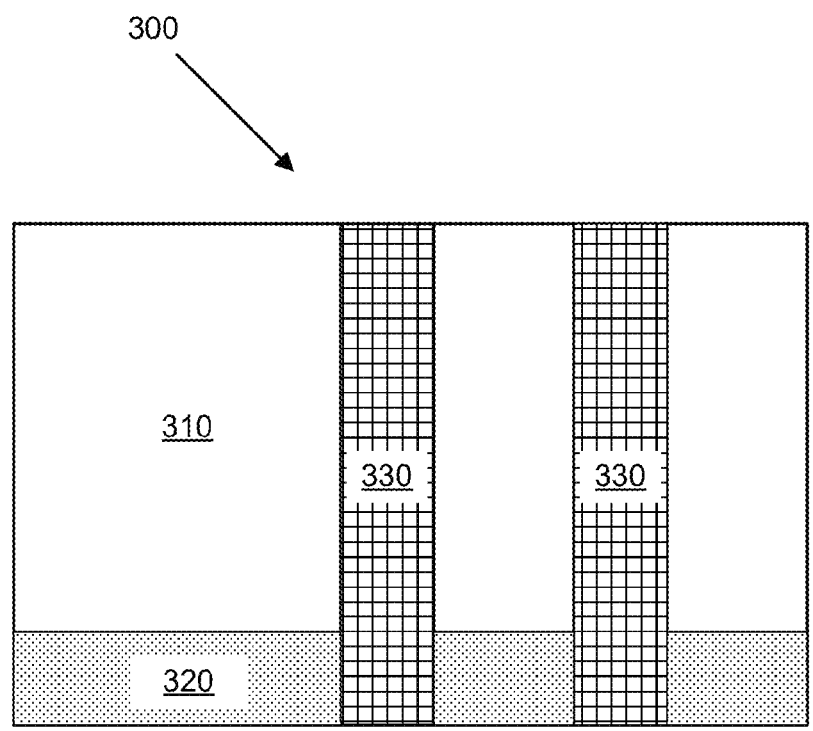
FIG. 3 illustrates a cross-section of an example of a structure with a polysilicon layer over an underlying layer and having multiple vertical structures.

FIG. 3 illustrates a cross-section of an example of a device structure with a polysilicon layer. As illustrated in the device structure 300 in FIG. 3, the polysilicon layer 310 can be over an underlying layer 320, which can include $Si_3N_4$. The polysilicon layer 310 can also be separated by multiple vertical structures 330 that can each include TiN and/or $Si_3N_4$, for example. In some embodiments, the polysilicon layer 310 can include polysilicon that is annealed. Annealed polysilicon can be more crystalline and relaxed than non-annealed polysilicon, and can etch at a different rate than non-annealed polysilicon. It will be understood by a person of ordinary skill in the art that the polysilicon layer 310 can be surrounded and/or separated by any number of different materials.

In the example in FIG. 3, the device structure 300 may be a memory device. The underlying $Si_3N_4$ layer 320 can serve as an etch stop and the TiN and $Si_3N_4$ vertical structures 330 can be electrodes. In some embodiments, the polysilicon layer 310 is etched and then a space between the TiN and $Si_3N_4$ vertical structures 330 is filled with a dielectric material to create a capacitor in between the TiN and $Si_3N_4$ vertical structures 330.

In the example in FIG. 3, the thickness of the polysilicon layer 310 can be between about 1 µm and about 2 µm, such as between about 1.10 µm and about 1.35 µm. In addition, the TiN and $Si_3N_4$ vertical structures 330 can also be between about 1 µm and about 2 µm, such as between about 1.10 µm and about 1.35 µm. It will be understood by a person of ordinary skill in the art that the memory device structure 300 can have varying thicknesses and orientations.

In the example in FIG. 3, the dimensions of the polysilicon and other features can depend on the application and technology node. In some embodiments, the thickness of the polysilicon for removal can be about 1.3 µm, which can correspond to a 2x-nm node. For a technology node that is the 2x-nm, this can correspond to features (e.g., gate width) of about 22 nm or less. In some embodiments, the thickness of the polysilicon for removal can be about 1.5 µm, which can correspond to a 1x-nm node. For a technology node that is the 1x-nm node, this can correspond to features (e.g., gate width) of about 16 nm or less.

Process Conditions

The disclosed implementations described herein involve a method of removing polysilicon at a high etch rate with a high selectivity over exposed nitride and/or oxide structures. The method includes providing a wafer, where the wafer includes a polysilicon layer and an exposed nitride and/or oxide structure. The method further includes flowing an etchant including a hydrogen-based species and a fluorine-based species towards the wafer, exposing the etchant to a remote plasma to activate the hydrogen-based species and the fluorine-based species, and removing the polysilicon layer. The removal of the polysilicon layer is performed at a selectivity over the exposed nitride and/or oxide structure of greater than about 500:1. In some implementations, the selectivity over the exposed nitride and/or oxide structure is greater than about 1000:1, or greater than about 75000:1.

The wafer can include any semiconductor wafer, partially integrated circuit, printed circuit board, or other appropriate work piece. Process conditions may vary depending on the wafer size. Typically, many fabrication facilities are configured for 200 mm wafers, 300 mm, or 450 mm wafers. The disclosed implementations described herein are configured to operate on any suitable wafer size, such as 300 mm and 450 mm wafer technologies.

In some implementations, the removal of polysilicon can be carried out by a remote or downstream plasma reactor, such as the reactor described with respect to FIG. 2. The gases introduced into the reactor described in FIG. 2 can vary with the application. In some embodiments, an etch reaction can be carried out using a hydrogen-based etchant. The hydrogen-based etchant can include, for example, hydrogen ($H_2$). Another example can include ammonia ($NH_3$). In some embodiments, an etch reaction can be carried out using a combination of $H_2$ and a fluorinated species, such as nitrogen trifluoride ($NF_3$) or carbon tetrafluoride ($CF_4$). Gases such as $H_2$ and $NF_3$ are non-toxic and generally do not have adverse effects on the environment.

Using a hydrogen-based species as an etchant effectively etches polysilicon while acting as a reducing agent that minimizes the oxidation and loss of other exposed materials, such as TiN, $Si_3N_4$, and $SiO_2$. An oxidizing agent such as oxygen may increase the etch rate of polysilicon but may also oxidize and increase the losses to other exposed materials. Adding a fluorine-based species as an etchant with a hydrogen-based species can increase the etch rate of polysilicon, but can also increase the losses to other exposed materials if the concentration of the fluorinated-based species exceeds a certain limit.

As discussed earlier herein, the hydrogen-based species can include hydrogen gas ($H_2$) or ammonia ($NH_3$), and the fluorine-based species can include nitrogen trifluoride ($NF_3$) or carbon tetrafluoride ($CF_4$). Other examples of fluorine-based species can include sulfur hexafluoride ($SF_6$), hexafluoroethane ($C_2F_6$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. Exposure to a remote plasma can activate the hydrogen-based species and the fluorine-based species to form plasma-activated species, radicals, and charged species.

In some embodiments, removing the layer of polysilicon can occur at an etch rate of greater than about 1000 Å per minute. In some embodiments, the exposed nitride can include $Si_3N_4$. In some embodiments, the exposed nitride can include TiN. In some embodiments, the exposed oxide can include $SiO_2$, such as thermal oxide. The etch rates of the exposed nitride and/or oxide structure can be less than about 5 Å per minute, such as less than about 1 Å per minute. In some embodiments, the etch rates of the exposed nitride and/or oxide structure can be less than about 0.01 Å per minute. These etch rates may be achieved while the polysilicon etch rate is greater than about 1000 Å per minute.

The process conditions of the plasma etch can affect the etch rates of polysilicon and exposed nitrides and/or oxides. Various process parameters such as surface temperature, pressure, source power, flow rates of the gases, wafer size, and relative concentrations of the etchant gases can affect the process conditions and, hence, the etch rates of polysilicon and exposed nitrides and/or oxides. Such process parameters may be optimized within a "process window" to maximize the etch rate of polysilicon while limiting the etch rates of the exposed nitrides and/or oxides.

The introduction of the hydrogen-based species provides active species that will be ionized and radicalized in a remote plasma source to form a plasma. Without being limited by any theory, the etching of polysilicon can occur by successive addition of adsorbed hydrogen atoms to silicon atoms to form Si—$H_x$ complexes, where the number of chemisorbed hydrogen atoms grows from x=1, 2, and 3, i.e., SiH, $SiH_2$, and $SiH_3$. Such a reaction mechanism occurs at least in the presence of pure $H_2$ plasma. The addition of a hydrogen atom to $SiH_3$ promotes formation of volatile silane, $SiH_4$, which facilitates etching of polysilicon. The following equation can describe the overall Si-etch reaction: $Si_{(s)}+4H \rightarrow SiH_{4(g)}$.

Other reactions may also occur to facilitate the removal of polysilicon. Activated fluorine atoms may react with silicon atoms and form volatile tetrafluorosilane, $SiF_4$ in the following reaction: $Si_{(s)}+4F_{(g)} \rightarrow SiF_{4(g)}$. Also, the mixture of the hydrogen-based species and the fluorine-based species could form gas phase reactants, such as HF, $NH_4F \cdot HF$, and $NH_4F$. These gas phase reactants and other plasma-activated species can potentially react with silicon atoms to form a solid byproduct $(NH_4)_2SiF_6$. The solid byproduct is sublimed at slightly elevated temperatures (e.g., greater than about 75° C.) to form gaseous byproducts and thereby remove polysilicon. Thus, plasma-activated species as well as gas phase reactants from the etchant can collectively facilitate the etching of polysilicon.

Figure 4A:
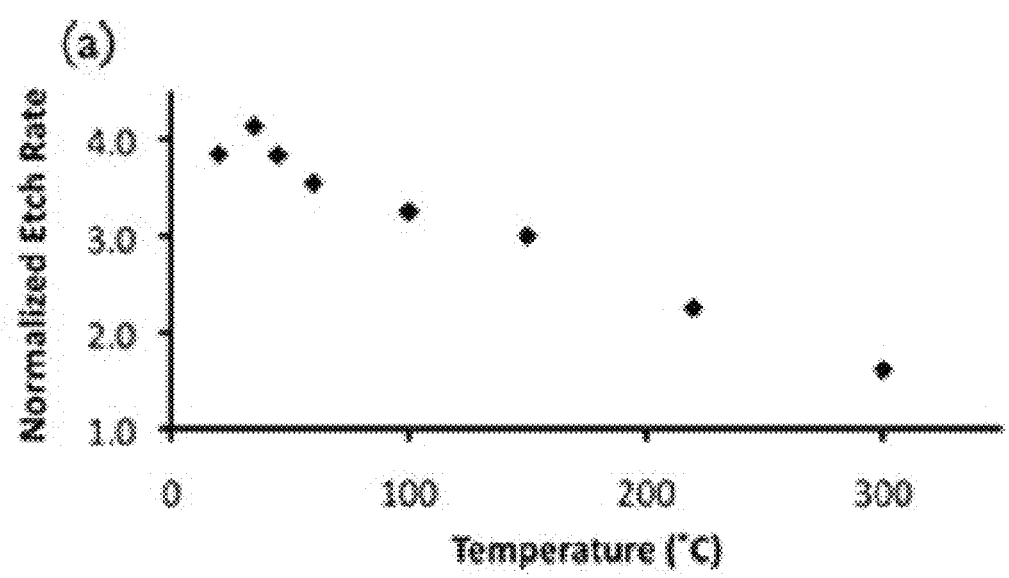
FIG. 4A illustrates a graph showing the polysilicon etch rate as a function of temperature for pure $H_2$ plasma.

For pure $H_2$ plasma, the polysilicon etch rate can be dependent on temperature. FIG. 4A illustrates a graph showing the polysilicon etch rate as a function of temperature for pure $H_2$ plasma. At temperatures of less than about 40° C., the etch rate of polysilicon increases with increasing temperature. At temperatures greater than about 40° C., the etch rate of polysilicon decreases with increasing temperature. As such, the maximum etch rate of polysilicon can exhibit a temperature maximum ($T_{max}$), such as $T_{max}$~40° C. Below $T_{max}$, increasing the temperature increases the thermal activation for the volatile silane formation, thereby increasing the polysilicon etch rate. Above the $T_{max}$, there can be recombination of H atoms on the polysilicon surface that consumes the chemisorbed H atoms needed for the formation of volatile $SiH_4$.

Figure 4B:
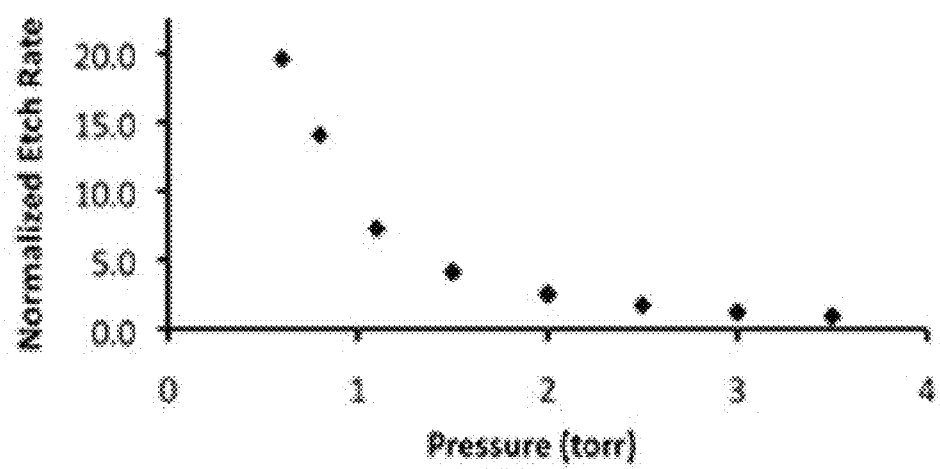
FIG. 4B illustrates a graph showing the polysilicon etch rate as a function of pressure for pure $H_2$ plasma.

For pure $H_2$ plasma, the polysilicon etch rate can be dependent on pressure. FIG. 4B illustrates a graph showing the polysilicon etch rate as a function of pressure for pure $H_2$ plasma. As pressure increases, the etch rate of polysilicon decreases steadily. However, it is possible that when the pressure goes below 0.6 Torr, a maximum in etch rate as a function of pressure can be observed. At pressures greater than about 0.6 Torr and less than about 3.5 Torr, the etch rate of polysilicon decreases. When pressure increases, the physisorption of hydrogen atoms on the polysilicon surface is expected to increase. The rate of surface recombination of physisorbed hydrogen atoms and chemisorbed hydrogen atoms can increase to form $H_2$ gas, resulting in the depletion of $SiH_x$ precursors. In addition, the rates of surface (wall) and volume recombination of hydrogen atoms also increase with pressure, which could give rise to lower concentrations of hydrogen radicals that are available for reaction with the polysilicon surface.

The addition of a fluorinated gas species, such as $NF_3$, with $H_2$ can change the etch behavior of polysilicon. Fluorine atoms can be generated by the dissociation of $NF_3$. The remote plasma can cause the dissociation of the fluorinated gas species to produce fluorine radicals. The fluorine radicals react with silicon to form gaseous byproducts, including a stable form of $SiF_4$. Thus, the polysilicon surface is not only etched by hydrogen atoms, but can also be etched by fluorine atoms. As such, the addition of a fluorinated gas species can generally increase the etch rate of polysilicon. There may also be reactions between the activated species generated from the dissociation of $H_2$ and those from the dissociation of $NF_3$ to form more complex plasma species. The latter species can then react with and etch the polysilicon surface. $NF_3$, $H_2$, and the plasma-activated species could also react in gas phase to generate a mixture of gas phase reactants such as HF, $NH_4F \cdot HF$, and $NH_4F$, which in turn react and ultimately remove the polysilicon surface.

The relative concentration of the fluorinated gas species can reach a certain limit to maintain desirable selectivity over the exposed nitride and/or oxide. In some embodiments, the concentration of the fluorinated gas species can be less than about 50% per volume. In some embodiments, the concentration of the fluorinated gas species can be less than about 20% per volume. In some embodiments, the concentration of fluorinated gas species is between about 0.7% and about 10% per volume.

Furthermore, the addition of an inert gas carrier may be used in some embodiments. Such carrier can increase the etch rate of polysilicon. It is believed that an inert gas carrier may reduce the likelihood of recombination of radicals in the gas phase. Examples of inert gas carriers can include noble gases, such as helium (He), neon (Ne), and argon (Ar). In some embodiments, for example, dilutions of about 5:1 of inert gas carrier to $H_2$ can be used.

Figure 5A:
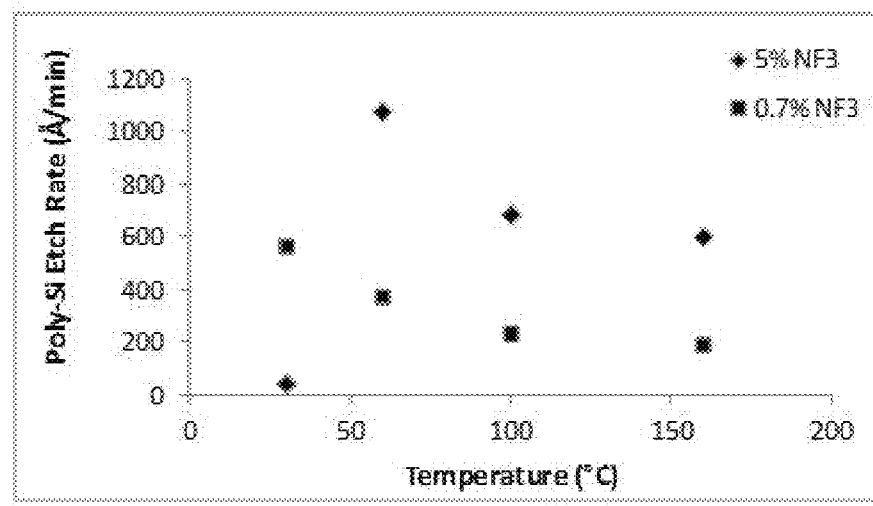
FIG. 5A illustrates a graph showing the polysilicon etch rate as a function of temperature for $H_2$ and $NF_3$ plasma.

For plasma with a gas mixture of $H_2$ and $NF_3$, the polysilicon etch rate exhibits a strong dependence on temperature. FIG. 5A illustrates a graph showing a polysilicon etch rate as a function of temperature. For a gas mixture with a concentration of about 5% $NF_3$, the etch rate of polysilicon increases to a maximum at $T_{max}$ between about 60° C. and about 80° C. When the temperature is greater than about $T_{max}$, the etch rate of polysilicon decreases. For a gas mixture with a concentration of about 0.7% $NF_3$, when the temperature is greater than about 30° C., the etch rate of polysilicon decreases. In this case, $T_{max}$ can occur at a temperature that is less than about 30° C. Additionally, for temperatures greater than about 40° C., the etch rate of polysilicon is higher for 5% $NF_3$ than for 0.7% $NF_3$. Thus, an increase in the concentration of a fluorinated gas species can lead to a higher etch rate of polysilicon.

Figure 5B:
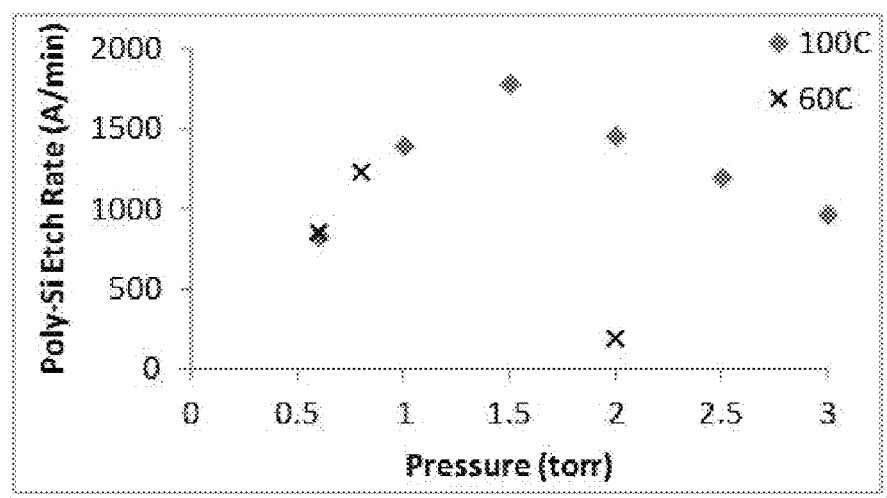
FIG. 5B illustrates a graph showing a polysilicon etch rate as a function of pressure for $H_2$ and $NF_3$ plasma.

For plasma with a gas mixture of $H_2$ and $NF_3$, the polysilicon etch rate also exhibits a strong dependence on pressure. FIG. 5B illustrates a graph showing a polysilicon etch rate as a function of pressure. When the temperature is fixed at about 100° C. for a gas mixture with about 5% $NF_3$, the etch rate of polysilicon increases with pressure between about 0.6 Torr and about 1.5 Torr. However, the etch rate of polysilicon decreases with pressure at pressures beyond about 1.5 Torr. When the temperature is fixed at about 60° C. for a gas mixture with about 5% $NF_3$, the etch rate of polysilicon also increases with pressure between about 0.6 Torr and about 0.8 Torr. At a high pressure of about 2 Torr, the etch rate is found to drop substantially. Thus, the maximum etch rate of polysilicon can be realized at a pressure of $P_{max}$ between about 1.0 Torr and about 1.5 Torr at about 5% $NF_3$ for both 60° C. and 100° C.

Process conditions such as temperature, pressure, flow rates, and relative concentrations of gas mixtures may be adjusted within a certain process window to optimize the etch rate of polysilicon. In some embodiments, the temperature can be between about 10° C. and about 160° C., such as between about 20° C. and about 110° C. or between about 35° C. and about 100° C. In some embodiments, the pressure can be between about 0.5 Torr and about 3.5 Torr, such as between about 1.5 Torr and about 3.5 Torr. In some embodiments, the relative concentration of the fluorinated gas species can be less than about 50% by volume, such as less than about 20% or less than about 10% by volume.

As the data suggests, to achieve etch rates of polysilicon in excess of about 1000 Å per minute, process conditions can be established such that the temperature is between about 60° C. and about 100° C., the pressure is between about 0.6 Torr and about 3.0 Torr, and the concentration of $NF_3$ is about 2% to 10% (e.g., about 5%) by volume. When the temperature is about 100° C. and the pressure is about 1 Torr, the etch rate of polysilicon can be greater than about 1100 Å per minute.

In addition to varying the process conditions to achieve a relatively efficient etch rate of polysilicon, the process conditions can be varied to achieve a low loss of exposed materials, such as $Si_3N_4$ and TiN. Other materials that may be used with polysilicon include $SiO_2$ and various metals.

Table I provides etch rates of $Si_3N_4$ and TiN expressed as relative losses of material as a function of temperature. The etch was performed for a duration of about 4.2 minutes. In this example, $Si_3N_4$ was formed by low-pressure chemical vapor deposition (LPCVD). The concentration of $NF_3$ was fixed at about 5% by volume and the pressure can be fixed at 0.6 Torr. To achieve the 5% by volume concentration of $NF_3$, the flow rate of the $NF_3$ was set to about 106 standard cubic centimeters per minute (sccm), where the flow rate of $H_2$ was set to about 2 standard liters per minute (slm). As the temperature increases between about 60° C. and about 250° C., the change in $Si_3N_4$ loss is extremely negligible. However, TiN loss is not as negligible at temperatures greater than about 100° C., and increases substantially with temperatures beyond 100° C. Thus, in polysilicon—TiN and/or polysilicon—$Si_3N_4$ structures, a temperature of between about 60° C. and about 100° C. may be appropriate. Under these process conditions, the loss of $Si_3N_4$ and TiN is less than about 10 Å.

TABLE I

| Temperature (° C.) | $Si_3N_4$ Loss (Å) | TiN Loss (Å) |
|---|---|---|
| 60 | ~0 | ~0 |
| 100 | ~0 | 2.9 |
| 160 | 0.4 | 42.3 |
| 250 | 1.3 | 56.7 |

At process conditions where the temperature is about 100° C. and the pressure is about 1 Torr for a concentration of $NF_3$ at about 5%, the etch rate of $Si_3N_4$ is about 1.0 Å per minute and the etch rate of TiN is about 0 Å per minute. At such process conditions, the etch selectivity of polysilicon over $Si_3N_4$ can be greater than 1000, and the etch selectivity of polysilicon over TiN can also be greater than 1000.

Figure 4C:
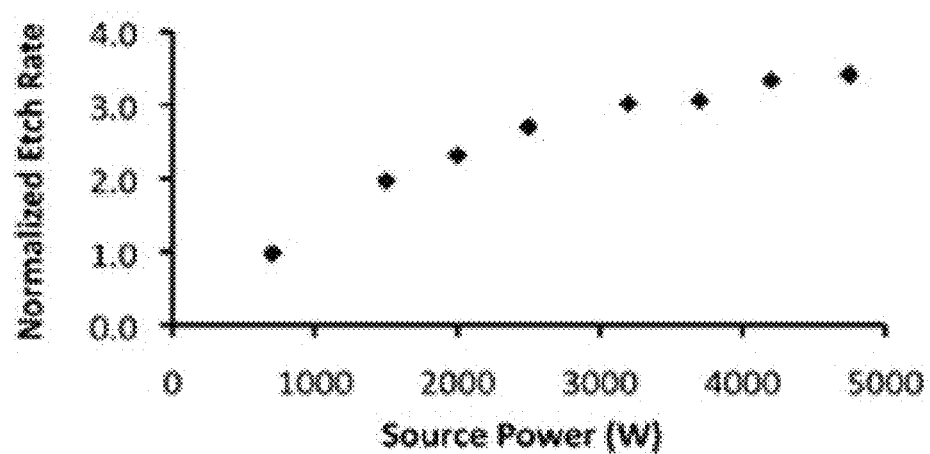
FIG. 4C illustrates a graph showing the polysilicon etch rate as a function of RF power for pure $H_2$ plasma.

In addition to process parameters such as temperature, pressure, and concentrations of gas mixtures, the RF power of the plasma source can also affect etch rates of polysilicon, $Si_3N_4$, and TiN. FIG. 4C illustrates a graph showing the etch rate of polysilicon as a function of RF power for pure $H_2$ plasma. The etch rate of polysilicon increases with increasing RF power for pure $H_2$ plasma. For a single 300 mm wafer, the etch rate of polysilicon approximately plateaus at a power, which can be about 3000 W for a Lam Research Corporation Gamma GxT tool. Beyond this maximum power, the recombination of hydrogen atoms may be substantial enough so that the etch rate of polysilicon does not appreciably change. Additionally, the etch rate of $Si_3N_4$ also increases with increasing RF power and plateaus at a relatively high RF power.

In some embodiments, an apparatus can be provided with multiple stations, as illustrated in FIG. 1, to provide different process conditions to achieve varying etch rates of materials. For example, some stations can have process conditions tailored to provide for a relatively high etch rate of polysilicon and a relatively low selectivity over exposed nitrides and/or oxides. Some stations can have process conditions tailored for a relatively low etch rate of polysilicon and a relatively high selectivity over exposed nitrides and/or oxides. Some stations can have process conditions tailored to remove a native oxide layer on top of a bulk polysilicon layer, with subsequent stations configured for removal of the bulk polysilicon layer. In certain embodiments, an apparatus can have a plurality of stations within a low temperature range (e.g., between about 20° C. and about 100° C.) and a high RF power (e.g., greater than about 3000 W for Gamma GxT) for a high etch rate of polysilicon and a high selectivity to $Si_3N_4$ and TiN. The apparatus can also have another plurality of stations within a high temperature range (e.g., between about 100° C. and about 250° C.) and a low RF power (e.g., less than about 3000 W for Gamma GxT) for a low etch rate of polysilicon and a low selectivity to TiN.

A remote plasma device as described earlier herein can provide radicals or other activated species adjacent to a wafer surface to react with the polysilicon. The remote plasma device minimizes ion bombardment at the wafer surface, and so minimizes ion impact damage, charging damage, and defects introduced by high fluxes of energetic photons that is otherwise caused by direct plasma exposure. Etching by direct plasma exposure can include, for example, dry reactive ion etching (RIE), which applies an external bias to control the direction of ions. Typically, RIE produces more ions than remote plasma etching. RIE apparatus employs a plasma source within the substrate chamber and uses complicated hardware in order to control the direction and energy of ions using an external bias. The complicated hardware of RIE is quite expensive in comparison to remote plasma device. For example, the cost of a typical RIE reactor is greater than a cost of a typical downstream plasma reactor (e.g., Gamma GxT) by about a factor of two. In addition, RIE can lead to higher loss amounts of sidewalls in a device structure as illustrated in the example in FIG. 2, as such sidewalls are subjected to ion and electron bombardment as the polysilicon is being etched.

For removal of polysilicon, a bias voltage need not be applied in the remote or downstream plasma reactor. However, a bias voltage may need to be applied for the removal of residue that is left behind post polysilicon etch. To effectively remove residue left behind after the bulk polysilicon has been etched, a bias voltage may be used with the remote or downstream plasma reactor.

Photolithography

The apparatus/process described hereinabove may be used in conjunction with lithographic patterning tools or processes (for example, for the fabrication or manufacture of semiconductor devices, displays, LEDs, photovoltaic panels and the like). Typically, though not necessarily, such tools/processes will be used or conducted together in a common fabrication facility. Lithographic patterning of a film typically includes some or all of the following steps, with each step enabled with a number of possible tools: (1) application of photoresist on a work piece (i.e., substrate, using a spin-on or spray-on tool); (2) curing of photoresist using a hot plate or furnace or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of removing polysilicon from a wafer, the method comprising:
   providing a wafer, wherein the wafer includes:
      a polysilicon layer; and
      an exposed nitride and/or oxide structure;
   flowing an etchant including a hydrogen-based species and a fluorine-based species towards the wafer, wherein a concentration of the fluorine-based species is between about 0.7% and about 10% by volume and a concentration of the hydrogen-based species is greater than the concentration of the fluorine-based species;
   exposing the etchant to a remote plasma to activate the hydrogen-based species and the fluorine-based species; and
   removing the polysilicon layer at a selectivity over the exposed nitride and/or oxide structure of greater than about 500:1.

2. The method of claim 1, wherein the hydrogen-based species includes hydrogen or ammonia.

3. The method of claim 1, wherein the fluorine-based species includes nitrogen trifluoride or carbon tetrafluoride.

4. The method of claim 1, wherein removing the polysilicon layer is performed at a selectivity over the exposed nitride and/or oxide structure of greater than about 1000:1.

5. The method of claim 1, wherein the exposed nitride structure includes silicon nitride or titanium nitride.

6. The method of claim 1, wherein the exposed oxide structure includes silicon dioxide.

7. The method of claim 1, wherein removing the polysilicon layer is performed at an etch rate of greater than about 1000 Å per minute.

8. The method of claim 1, wherein an etch rate of the exposed nitride and/or oxide structure is less than about 5 Å per minute during removal of the polysilicon layer.

9. The method of claim 1, wherein the remote plasma is generated from a downstream plasma reactor.

10. The method of claim 9, wherein the downstream plasma reactor includes a ceramic dome.

11. The method of claim 1, wherein removing the polysilicon layer is performed in a chamber at a temperature between about 60° C. and about 100° C.

12. The method of claim 1, wherein removing the polysilicon layer is performed in a chamber having a pressure between about 1 Torr and about 3 Torr.

13. The method of claim 1, wherein the exposed nitride and/or oxide structure are part of a memory device.

14. The method of claim 1, wherein the hydrogen-based species is hydrogen.

15. The method of claim 14, wherein the flow rate of hydrogen is about equal to or greater than 2 standard liters per minute.

* * * * *